(12) United States Patent
Li et al.

(10) Patent No.: US 9,148,720 B2
(45) Date of Patent: Sep. 29, 2015

(54) MULTIMEDIA OUTPUT DEVICE WITH DETECTION AND PROTECTION CIRCUIT AND AUDIO OUTPUT METHOD THEREOF

(75) Inventors: Jhong-Lin Li, Taipei (TW); Yen-Hsun Chen, Taipei (TW); Yu-Wei Lo, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 718 days.

(21) Appl. No.: 13/472,483

(22) Filed: May 16, 2012

(65) Prior Publication Data

US 2012/0300948 A1    Nov. 29, 2012

Related U.S. Application Data

(60) Provisional application No. 61/490,612, filed on May 27, 2011.

(51) Int. Cl.
| | | |
|---|---|---|
| *H04R 25/00* | (2006.01) | |
| *H04R 3/00* | (2006.01) | |
| *H03G 3/34* | (2006.01) | |

(52) U.S. Cl.
CPC .................. *H04R 3/00* (2013.01); *H03G 3/348* (2013.01); *H04R 2420/05* (2013.01)

(58) Field of Classification Search
None
See application file for complete search history.

(56) References Cited

U.S. PATENT DOCUMENTS

| | | | |
|---|---|---|---|
| 4,173,740 A | 11/1979 | Nagata et al. | |
| 7,349,546 B2 | 3/2008 | Ganton | |
| 7,697,697 B2* | 4/2010 | Su et al. | ........................ 381/74 |
| 2005/0201568 A1* | 9/2005 | Goyal | ............................ 381/74 |
| 2008/0112572 A1* | 5/2008 | Wong et al. | .................... 381/74 |

FOREIGN PATENT DOCUMENTS

| | | |
|---|---|---|
| JP | 3163996 | 7/1991 |
| JP | 2008258724 | 10/2008 |

\* cited by examiner

*Primary Examiner* — Joseph Saunders, Jr.
*Assistant Examiner* — James Mooney
(74) *Attorney, Agent, or Firm* — Jianq Chyun IP Office (57) ABSTRACT

A multimedia output device and an audio output method thereof are provided. The multimedia output device is electrically connected to an external speaker. The audio output method includes following steps. The multimedia output device determines whether an identification resistor exists in the external speaker. If the identification resistor exists in the external speaker, the multimedia output device determines whether the identification resistor complies with a predetermined resistance range. If the identification resistor complies with the predetermined resistance range, the multimedia output device outputs an audio signal to the external speaker to be played.

11 Claims, 6 Drawing Sheets

MULTIMEDIA OUTPUT DEVICE WITH DETECTION AND PROTECTION CIRCUIT AND AUDIO OUTPUT METHOD THEREOF

CROSS-REFERENCE TO RELATED APPLICATION

This application claims the priority benefits of U.S. provisional application Ser. No. 61/490,612, filed on May 27, 2011. The entirety of the above-mentioned patent applications is hereby incorporated by reference herein and made a part of this specification.

BACKGROUND OF THE INVENTION

1. Field of the Invention

The invention generally relates to a technique for protecting an external speaker, and more particularly, to a multimedia output device for protecting an external speaker and an audio output method thereof.

2. Description of Related Art

In recent design of multimedia playing system, a manufacturer usually splits the speaker unit into a treble module and a bass module and places the bass module into the machine as much as possible, so as to bring a better audio experience to the users. However, with such a design, it is difficult to balance between the volume of the speaker unit and the size of the machine. Additionally, it is impossible to place a high-power bass speaker unit into a portable multimedia device that is designed very light, small, and slim.

Moreover, a first connector of an external speaker may be a two-pole plug or a three-pole plug used for electrically connecting a second connector of a multimedia playing system. A short circuit may be produced due to the mechanical characteristics of the first connector and the second connector.

Furthermore, a conventional multimedia playing system does not have any protection circuit for an external speaker. Instead, audio signals are directly output to the external speaker to be played. Thereby, when an external speaker with a wrong connector is plugged into a conventional multimedia playing system, neither the system nor the external speaker is protected.

SUMMARY OF THE INVENTION

Accordingly, the invention is directed to a multimedia output device and an audio output method thereof, so as to resolve the problems in conventional techniques.

The invention provides a multimedia output device adapted to an external speaker. The external speaker has a speaker unit, an identification resistor, and a first connector. The multimedia output device has a second connector, a detection and protection circuit, and a playing circuit. The second connector is electrically connected with the first connector. The multimedia output device is coupled to the speaker unit and the identification resistor, wherein the second connector has at least two sections coupled with the identification resistor. The detection and protection circuit is electrically connected with the second connector. The detection and protection circuit detects the identification resistor and determines whether the identification resistor complies with a predetermined resistance range. If the identification resistor complies with the predetermined resistance range, the detection and protection circuit outputs an enabling signal. The playing circuit is electrically connected with the second connector and the detection and protection circuit. When the playing circuit receives the enabling signal, it outputs an audio signal to the speaker unit to be played.

According to an embodiment of the invention, the second connector has at least four sections respectively defined as a first driving section, a second driving section, a first detecting section, and a second detecting section, wherein when the second connector is connected with the first connector, the first detecting section and the second detecting section are electrically connected to the identification resistor, and the first driving section and the second driving section are configured to connect to the speaker unit.

According to an embodiment of the invention, the first connector has four sections which are the same as and corresponding to the four sections of the second connector.

According to an embodiment of the invention, the detection and protection circuit includes a first resistor, a second resistor, and a third resistor. When the external speaker is connected to the multimedia output device, the first resistor, the identification resistor, and the second resistor are serially connected, and a first node voltage is generated at where the first resistor and the identification resistor are coupled with each other. When the external speaker is not connected to the multimedia output device, the first resistor and the third resistor are serially connected, and a second node voltage is generated at where the first resistor and the third resistor are coupled with each other, wherein the first node voltage is different from the second node voltage.

According to an embodiment of the invention, when the external speaker is connected to the multimedia output device, the detection and protection circuit generates a first node voltage according to the identification resistor and determines whether the identification resistor complies with the predetermined resistance range according to the first node voltage.

According to an embodiment of the invention, the detection and protection circuit includes a first comparator, a second comparator, and an AND gate. A positive input terminal of the first comparator receives a first operating voltage, and a negative input terminal of the first comparator receives the first node voltage. A positive input terminal of the second comparator receives the first node voltage, and a negative input terminal of the second comparator receives a second operating voltage, wherein the first operating voltage is greater than the second operating voltage. The AND gate determines whether to output the enabling signal according to the output of the first comparator and the output of the second comparator.

The invention provides an audio output method for coordinating a multimedia output device and an external speaker. The multimedia output device is electrically connected with the external speaker. The audio output method includes following steps. The multimedia output device determines whether an identification resistor exists in the external speaker. When the identification resistor exists, the multimedia output device determines whether the identification resistor complies with a predetermined resistance range. When the identification resistor complies with the predetermined resistance range, the multimedia output device outputs an audio signal to the external speaker.

According to an embodiment of the invention, in the audio output method, the external speaker has a speaker unit, the identification resistor, and a first connector. The first connector has at least four sections respectively defined as a first driving section, a second driving section, a first detecting section, and a second detecting section.

According to an embodiment of the invention, in the audio output method, the multimedia output device includes a second connector, and the second connector has four sections which are the same as and corresponding to the four sections of the first connector, such that when the second connector is electrically connected with the first connector, the multimedia output device can be coupled to the speaker unit and the identification resistor.

According to an embodiment of the invention, in the audio output method, the multimedia output device further includes a detection and protection circuit and a playing circuit. The detection and protection circuit is electrically connected with the second connector. The detection and protection circuit detects the identification resistor and determines whether the identification resistor complies with a predetermined resistance range. If the identification resistor complies with the predetermined resistance range, the detection and protection circuit outputs an enabling signal. The playing circuit is electrically connected with the second connector and the detection and protection circuit. When the playing circuit receives the enabling signal, it outputs an audio signal to the speaker unit to be played.

According to an embodiment of the invention, the step of determining whether the identification resistor complies with the predetermined resistance range includes executing a conversion procedure on a logic state of the identification resistor and determining whether the identification resistor complies with the predetermined resistance range according to the logic state.

According to an embodiment of the invention, in the audio output method, the first detecting section and the second detecting section are respectively and electrically connected to the identification resistor, and the first driving section and the second driving section are configured to connect to the speaker unit.

As described above, an external speaker in the invention has an identification resistor. When a multimedia output device is connected with the external speaker, the multimedia output device detects the identification resistor and determines whether the identification resistor complies with a predetermined resistance range. The multimedia output device outputs an audio signal to the external speaker to be played only when the identification resistor complies with the predetermined resistance range. On the other hand, a detection and protection circuit in the multimedia output device can prevent the problem of short circuit caused by any unexpected external speaker. Thereby, the external speaker and the entire system can be effectively protected in an application.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
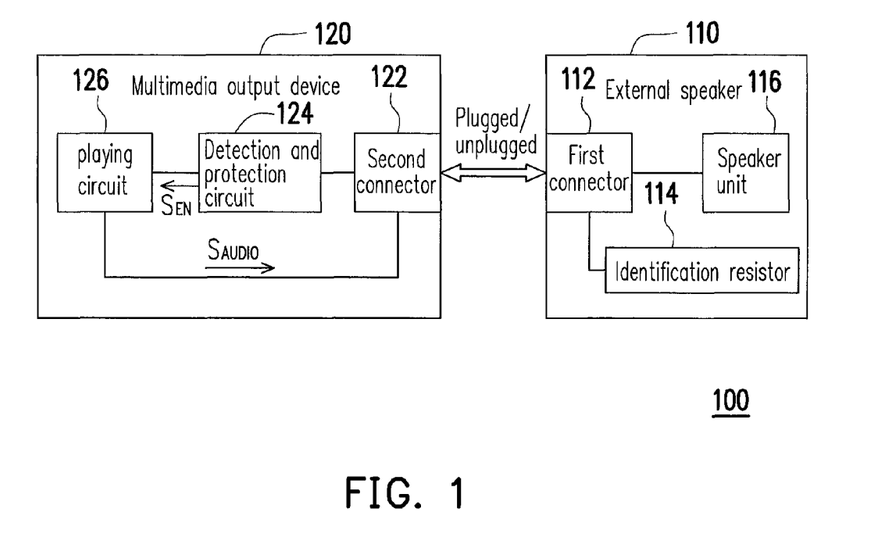
FIG. 1 is a block diagram of an audio playing system according to an embodiment.

FIG. 1 is a block diagram of an audio playing system according to an embodiment. Referring to FIG. 1, the audio playing system 100 includes an external speaker 110 and a multimedia output device 120. The multimedia output device 120 can play audio when it is plugged into the external speaker 110. The external speaker 110 has a first connector 112, an identification resistor 114, and a speaker unit 116. The first connector 112 is electrically connected to the identification resistor 114 and the speaker unit 116. The multimedia output device 120 includes a second connector 122, a detection and protection circuit 124, and a playing circuit 126. The detection and protection circuit 124 is electrically connected with the second connector 122, and the playing circuit 126 is electrically connected with the second connector 122 and the detection and protection circuit 124.

Figure 3:
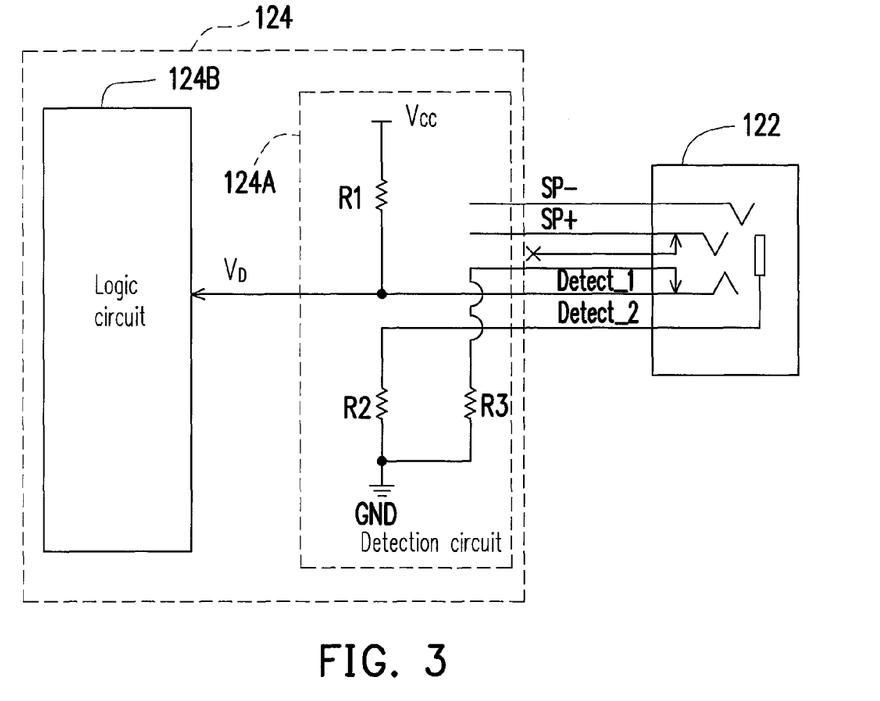
FIG. 3 is a circuit diagram of a detection and protection circuit and an second connector according to an embodiment.

Herein the connection between the multimedia output device 120 and the external speaker 110 will be first explained in detail. When the second connector 122 is electrically connected with the first connector 112, the multimedia output device 120 is coupled to the identification resistor 114 and the speaker unit 116 through aforementioned connectors. The second connector 122 has a plurality of sections. As shown in FIG. 3, the four sections of the second connector 122 are respectively defined as a first driving section SP+, a second driving section SP−, a first detecting section Detect_1, and a second detecting section Detect_2. However, the invention is not limited to such section definition. At least two sections (as shown in FIG. 3, the first detecting section Detect_1 and the second detecting section Detect_2) of the second connector 122 are coupled to the identification resistor 114.

The detection and protection circuit 124 is configured to detect the identification resistor 114 and determine whether the identification resistor 114 complies with a predetermined resistance range. If the identification resistor 114 complies with the predetermined resistance range, the multimedia output device 120 is electrically connected a matching external speaker 110 and accordingly outputs an enabling signal $S_{EN}$. When the playing circuit 126 receives the enabling signal $S_{EN}$, it outputs an audio signal $S_{AUDIO}$ to the external speaker 110, so that the audio signal $S_{AUDIO}$ can be played by the speaker unit 116.

Figure 2:
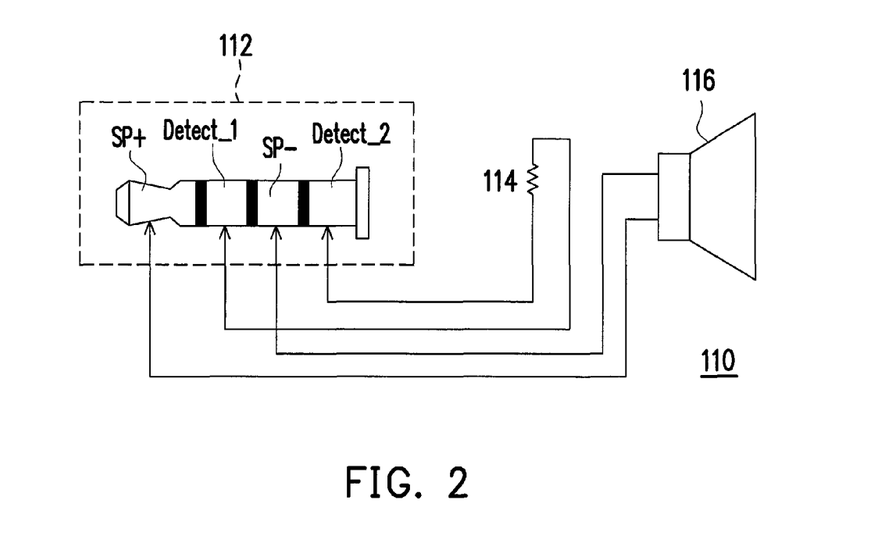
FIG. 2 is a detailed circuit diagram of an external speaker according to an embodiment.

Below, the first connector 112 of the external speaker 110 will be explained in detail. FIG. 2 is a detailed circuit diagram of the external speaker 110 according to an embodiment.

Referring to FIG. 2, the first connector 112 of the external speaker 110 has at least four sections respectively defined as a first driving section SP+, a second driving section SP−, a first detecting section Detect_1, and a second detecting section Detect_2. The first detecting section Detect_1 and the second detecting section Detect_2 are respectively and electrically connected to both ends of the identification resistor 114, and the first driving section SP+ and the second driving section SP− are configured to connect to the speaker unit 116. It should be noted that the sequence of the sections in the first connector 112 can be changed but have to be disposed corresponding to the sections of the second connector 122.

How to determine whether the identification resistor 114 complies with the predetermined resistance range will be explained in detail below.

Figure 4:
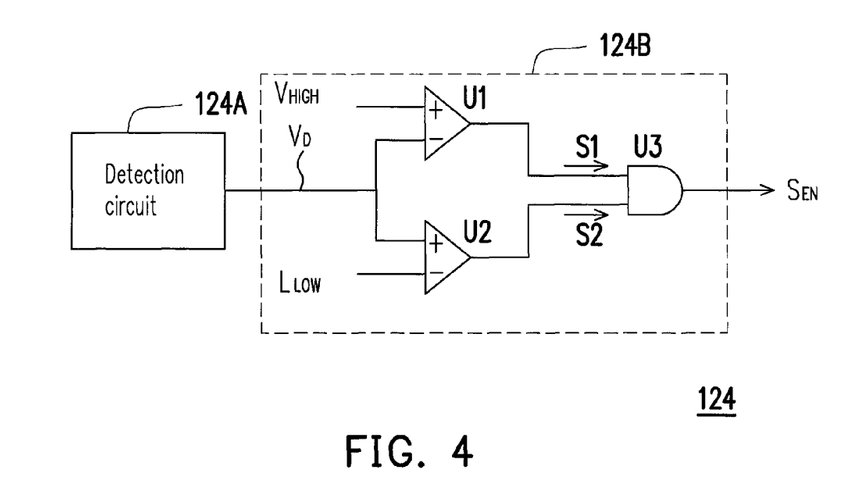
FIG. 4 is a detailed circuit diagram of a detection and protection circuit according to an embodiment.
Figure 5:
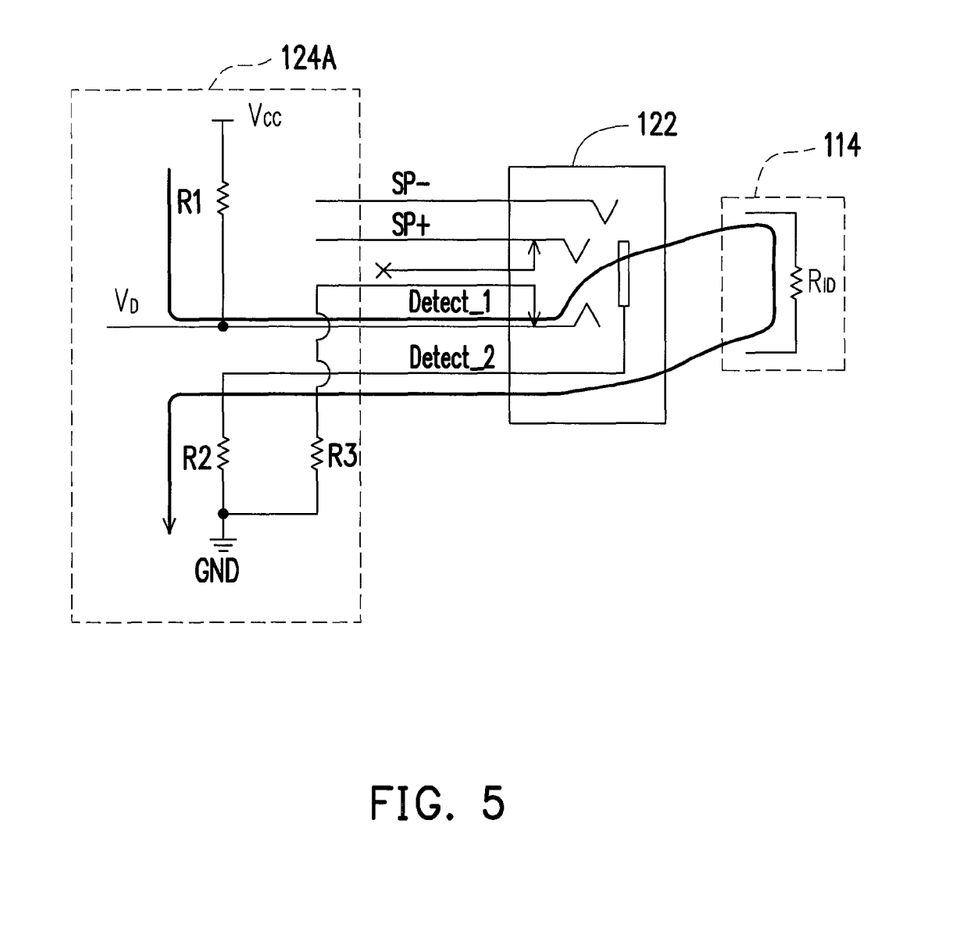
FIG. 5 is a diagram illustrating the connection between a second connector and an identification resistor according to an embodiment.
Figure 6A:
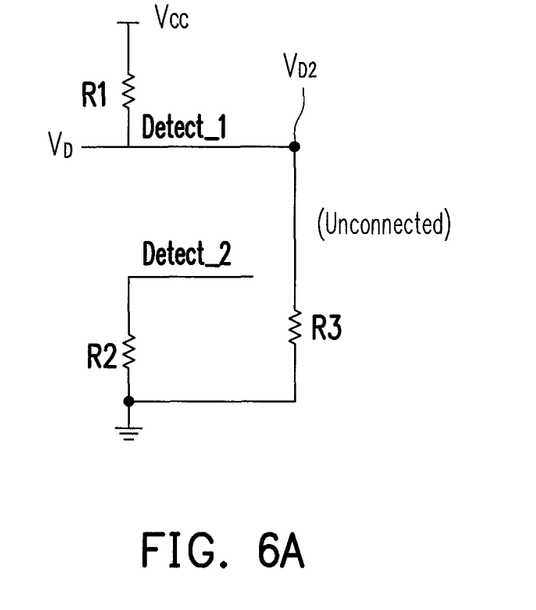
FIG. 6A is a diagram illustrating a second connector not connected to an identification resistor according to an embodiment.
Figure 6B:
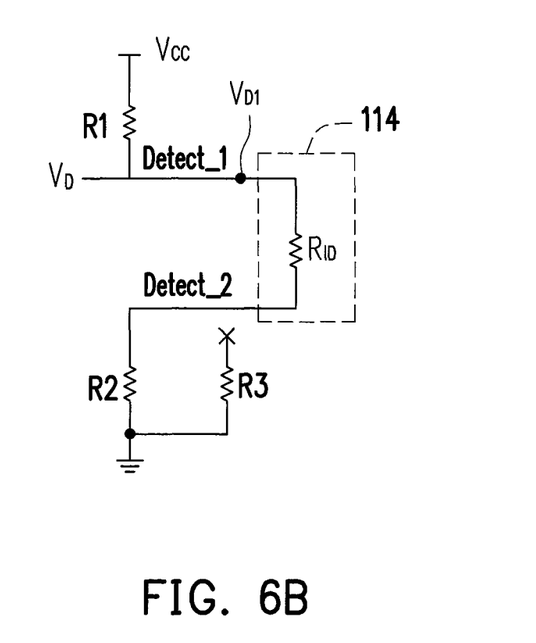
FIG. 6B is a diagram illustrating a normal connection between a second connector and an identification resistor according to an embodiment.
Figure 6C:
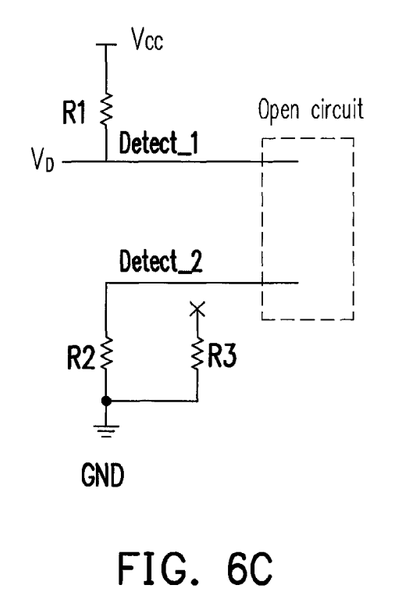
FIG. 6C is a diagram illustrating an open circuit according to an embodiment.
Figure 6D:
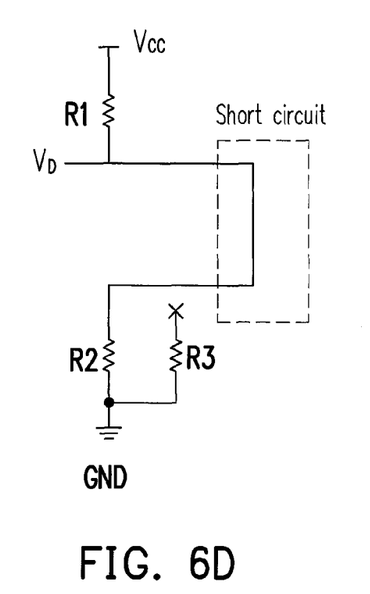
FIG. 6D is a diagram illustrating a short circuit according to an embodiment.

FIG. 3 is a circuit diagram of the detection and protection circuit 124 and the second connector 122 according to an embodiment. FIG. 4 is a detailed circuit diagram of the detection and protection circuit 124 according to an embodiment. FIG. 5 is a diagram illustrating the connection between the second connector 122 and the identification resistor 114 according to an embodiment. FIGS. 6A-6D illustrate the identification states between the connectors, wherein FIG. 6A illustrates an unconnected state, FIG. 6B illustrates a normally connected state, FIG. 6C illustrates an open circuit, and FIG. 6D illustrates a short circuit.

Referring to both FIG. 3 and FIG. 4 first, the second connector 122 has four sections (i.e., a first driving section SP+, a second driving section SP−, a first detecting section Detect_1, and a second detecting section Detect_2) that are the same as and corresponding to the four sections of the first connector 112. The detection and protection circuit 124 includes a detection circuit 124A and a logic circuit 124B. The detection circuit 124A includes a first resistor R1, a second resistor R2, and a third resistor R3. When the external speaker 110 is connected to the multimedia output device 120, the first resistor R1, the identification resistor 114, and the second resistor R2 are serially connected, and a first node voltage $V_{D1}$ is generated at the coupling point Detect_1 between the first resistor R1 and the identification resistor 114 (please refer to FIG. 5 and FIG. 6B). When the external speaker 110 is not connected to the multimedia output device 120, the first resistor R1 and the third resistor R3 are serially connected, and a second node voltage $V_{D2}$ is generated at the coupling point Detect_1 between the first resistor R1 and the third resistor R3 (please refer to FIG. 6A). Herein the first node voltage $V_{D1}$ is different from the second node voltage $V_{D2}$.

Additionally, in the identification states between the first connector 112 and the second connector 122 illustrated in FIGS. 6A-6D, it is assumed that the first resistor R1 is electrically connected between an operating voltage $V_{cc}$ and the first detecting section Detect_1 and the second resistor R2 is electrically connected between the ground GND and the second detecting section Detect_2, and the resistance of the identification resistor 114 is expressed as $R_{ID}$. The node voltage at the first detecting section Detect_1 is analyzed as following:

1. In FIG. 6A, the identification resistor is not connected to, and the node voltage $V_D = V_{D2} = V_{CC} \times R3/(R1+R3)$.
2. In FIG. 6B, the identification resistor 114 is normally connected to, and the node voltage $V_D = V_{D1} = V_{CC} \times (R_{ID}+R2)/(R1+R_{ID}+R2)$.
3. In FIG. 6C, the identification resistor presents an open-circuited state, and the node voltage $V_D = V_{CC}$.
4. In FIG. 6D, the identification resistor presents a short-circuited state, and the node voltage $V_D = V_{CC} \times R2/(R1+R2)$.

Referring to FIG. 4 again, after the detection circuit 124A obtains the node voltage $V_D$, the logic circuit 124B executes a conversion procedure on the logic state of the node voltage $V_D$. The logic circuit 124B includes a first comparator U1, a second comparator U2, and an AND gate U3. A positive input terminal of the first comparator U1 receives a first operating voltage $V_{HIGH}$, and a negative input terminal thereof receives the node voltage $V_D$. A positive input terminal of the second comparator U2 receives the node voltage $V_D$, and a negative input terminal thereof receives a second operating voltage $V_{LOW}$. Herein the first operating voltage $V_{HIGH}$ should be greater than the second operating voltage $V_{LOW}$. Besides, the AND gate U3 determines whether to output the enabling signal $S_{EN}$ according to the output signal S1 of the first comparator U1 and the output signal S2 of the second comparator U2. Following table 1 shows the true values of various logic states. Please refer to following table 1 regarding the conversion procedure executed by the logic circuit 124B.

TABLE 1

| Node Voltage $V_D$ | State ($V_{HIGH} > V_{LOW}$) | S1 | S2 | $S_{EN}$ |
|---|---|---|---|---|
| An external speaker is plugged, and an identification resistor compliant with a predetermined resistance range exists. | $V_{LOW} < V_D < V_{HIGH}$ | 1 | 1 | 1 |
| Open circuit | $V_D > V_{HIGH}$ | 0 | 1 | 0 |
| Not plugged, short circuit, or a two-pole plug or a three-pole plug is plugged | $V_D < V_{LOW}$ | 1 | 0 | 0 |

As described above, since the detection and protection circuit 124 includes the detection circuit 124A and the logic circuit 124B, it can generate the node voltage $V_D$ according to the identification resistor 114 and then execute a logic state conversion procedure to determine whether the identification resistor 114 complies with the predetermined resistance range. Namely, when the enabling signal $S_{EN}$ is at a logic high level "1", the identification resistor 114 is within the predetermined resistance range, and when the enabling signal $S_{EN}$ is at a logic low level "0", the identification resistor 114 is not within the predetermined resistance range. Thus, when the playing circuit 126 receives the enabling signal $S_{EN}$ at the logic high level "1", the playing circuit 126 is enabled and starts to output the audio signal $S_{AUDIO}$ to the speaker unit 116 to be played. As to any external speaker out of the predetermined resistance range, the playing circuit 126 does not output the audio signal $S_{AUDIO}$.

It can be well understood based on foregoing description that the external speaker 110 in the audio playing system 100 has the identification resistor 114, and the multimedia output device 120 can detect the identification resistor 114 and determine whether the identification resistor 114 complies with a predetermined resistance range. Only when the identification resistor 114 complies with the predetermined resistance range, the multimedia output device 120 outputs the audio signal $S_{AUDIO}$ to the external speaker 110 to be played. On the other hand, the detection and protection circuit 124 in the multimedia output device 120 can prevent short circuit caused by any unexpected external speaker. Accordingly, the external speaker 110 and the entire system can be effectively protected in an application.

Figure 7:
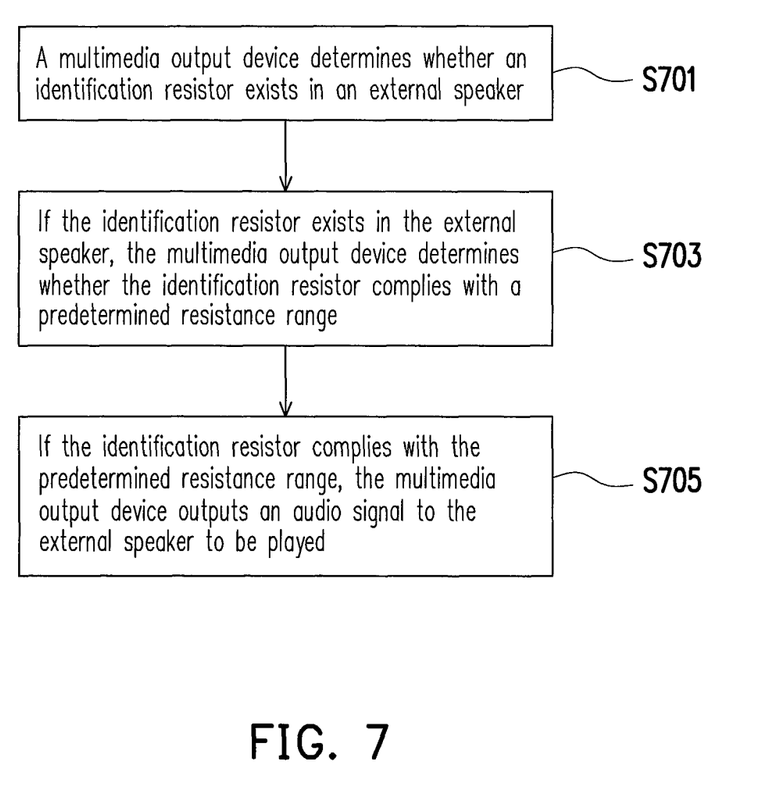
FIG. 7 is a flowchart of an audio output method according to an embodiment.

A general audio output method can be summarized based on the embodiments described above. FIG. 7 is a flowchart of an audio output method according to an embodiment. Referring to FIG. 7, a multimedia output device is electrically connected to an external speaker. The audio output method in the present embodiment includes following steps.

The multimedia output device determines whether an identification resistor exists in the external speaker (step S701) (whether the external speaker has a resistor for identification is first checked).

If the identification resistor exists, the multimedia output device determines whether the identification resistor complies with a predetermined resistance range (step S703) (i.e., whether an external speaker compatible with the multimedia output device is plugged).

If the identification resistor complies with the predetermined resistance range, the multimedia output device outputs an audio signal to the external speaker to be played (step S705) (i.e., the audio signal is only played by expected external speaker, and unexpected external speaker won't be used).

In the embodiment described above, in the step S703 for determining whether the identification resistor complies with the predetermined resistance range, a logic state conversion procedure is executed on the identification resistor (please refer to FIGS. 3-6D and table 1), and whether the identification resistor complies with the predetermined resistance range is determined according to the level of the logic state.

As described above, an external speaker in the invention has an identification resistor. When a multimedia output device is connected with the external speaker, the multimedia output device detects the identification resistor and determines whether the identification resistor complies with a predetermined resistance range. The multimedia output device outputs an audio signal to the external speaker to be played only when the identification resistor complies with the predetermined resistance range. On the other hand, a detection and protection circuit in the multimedia output device can prevent the problem of short circuit caused by any unexpected external speaker. Thereby, the external speaker and the entire system can be effectively protected in an application.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A multimedia output device, adapted to an external speaker, wherein the external speaker has a speaker unit, an identification resistor, and a first connector, the multimedia output device comprising:
   a second connector, electrically connected with the first connector, wherein the multimedia output device is coupled to the speaker unit and the identification resistor, and the second connector has at least two sections coupled with the identification resistor;
   a detection and protection circuit, electrically connected with the second connector, and configured to detect the identification resistor and determine whether the identification resistor complies with a predetermined resistance range, wherein when the identification resistor complies with the predetermined resistance range, the detection and protection circuit outputs an enabling signal; and
   a playing circuit, electrically connected with the second connector and the detection and protection circuit, wherein when the playing circuit receives the enabling signal, the playing circuit outputs an audio signal to the speaker unit to be played;
   wherein the detection and protection circuit comprises a first resistor, a second resistor, and a third resistor, when the external speaker is connected to the multimedia output device, the first resistor, the identification resistor, and the second resistor are serially connected, and a first node voltage is generated at where the first resistor and the identification resistor are coupled with each other, and when the external speaker is not connected to the multimedia output device, the first resistor and the third resistor are serially connected, and a second node voltage is generated at where the first resistor and the third resistor are coupled with each other, wherein the first node voltage is different from the second node voltage.

2. The multimedia output device according to claim 1, wherein the second connector has at least four sections respectively defined as a first driving section, a second driving section, a first detecting section, and a second detecting section, and when the second connector is connected with the first connector, the first detecting section and the second detecting section are electrically connected to the identification resistor, and the first driving section and the second driving section are connected with the speaker unit.

3. The multimedia output device according to claim 2, wherein the first connector has four sections which are the same as and corresponding to the four sections of the second connector.

4. The multimedia output device according to claim 1, wherein when the external speaker is connected to the multimedia output device, the detection and protection circuit generates a first node voltage according to the identification resistor and determines whether the identification resistor complies with the predetermined resistance range according to the first node voltage.

5. The multimedia output device according to claim 4, wherein the detection and protection circuit comprises:
   a first comparator, having a positive input terminal for receiving a first operating voltage and a negative input terminal for receiving the first node voltage;
   a second comparator, having a positive input terminal for receiving the first node voltage and a negative input terminal for receiving a second operating voltage, wherein the first operating voltage is greater than the second operating voltage; and
   an AND gate, determining whether to output the enabling signal according to an output of the first comparator and an output of the second comparator.

6. An audio output method, for coordinating a multimedia output device with an external speaker, wherein the multimedia output device is electrically connected with the external speaker, wherein the multimedia output device comprises a detection and protection circuit, and the detection and protection circuit comprises a first resistor, a second resistor, and a third resistor, when the external speaker is connected to the multimedia output device, the first resistor, an identification resistor, and the second resistor are serially connected, and a first node voltage is generated at where the first resistor and the identification resistor are coupled with each other, and when the external speaker is not connected to the multimedia output device, the first resistor and the third resistor are serially connected, and a second node voltage is generated at where the first resistor and the third resistor are coupled with each other, wherein the first node voltage is different from the second node voltage, the audio output method comprising:

determining whether the identification resistor exists in the external speaker by using the detection and protection circuit;

when the identification resistor exists, determining whether the identification resistor complies with a predetermined resistance range by using the detection and protection circuit; and when the identification resistor complies with the predetermined resistance range, outputting an audio signal to the external speaker by using the multimedia output device.

7. The audio output method according to claim 6, wherein the external speaker has a speaker unit, the identification resistor, and a first connector, and the first connector has at least four sections respectively defined as a first driving section, a second driving section, a first detecting section, and a second detecting section.

8. The audio output method according to claim 7, wherein the multimedia output device further comprises a second connector, electrically connected with the detection and protection circuit, and the second connector has four sections which are the same as and corresponding to the four sections of the first connector, such that when the second connector is electrically connected with the first connector, the multimedia output device is coupled to the speaker unit and the identification resistor.

9. The audio output method according to claim 8, wherein the multimedia output device further comprises:

a playing circuit, electrically connected with the second connector and the detection and protection circuit, wherein when the playing circuit receives an enabling signal from the detection and protection circuit, the playing circuit outputs an audio signal to the speaker unit to be played.

10. The audio output method according to claim 7, wherein the first detecting section and the second detecting section are respectively and electrically connected to the identification resistor, and the first driving section and the second driving section are configured to connect to the speaker unit.

11. The audio output method according to claim 6, wherein the step of determining whether the identification resistor complies with the predetermined resistance range comprises:

executing a conversion procedure on a logic state of the identification resistor; and determining whether the identification resistor complies with the predetermined resistance range according to the logic state.

* * * * *